US012616024B2

(12) United States Patent
Liu

(10) Patent No.: US 12,616,024 B2
(45) Date of Patent: Apr. 28, 2026

(54) SEMICONDUCTOR PACKAGE STRUCTURE

(71) Applicant: CHANGXIN MEMORY TECHNOLOGIES, INC., Hefei City (CN)

(72) Inventor: Chih-Cheng Liu, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 363 days.

(21) Appl. No.: 18/364,484

(22) Filed: Aug. 3, 2023

(65) Prior Publication Data

US 2024/0105593 A1      Mar. 28, 2024

Related U.S. Application Data

(63) Continuation of application No. PCT/CN2022/128683, filed on Oct. 31, 2022.

(30) Foreign Application Priority Data

Sep. 22, 2022    (CN) .......................... 202211157657.X

(51) Int. Cl.
  *H10W 20/40*          (2026.01)
  *H10B 80/00*          (2026.01)
      (Continued)

(52) U.S. Cl.
  CPC .......... *H10W 20/497* (2026.01); *H10B 80/00* (2023.02); *H10W 20/20* (2026.01); *H10W 90/00* (2026.01); *H10W 90/724* (2026.01)

(58) Field of Classification Search
  CPC ... H01L 23/5227; H01L 23/481; H01L 25/18; H01L 24/16; H01L 2224/16225;
      (Continued)

(56) References Cited

U.S. PATENT DOCUMENTS

| 8,143,952 | B2 | 3/2012 | Kim et al. |
| 8,941,212 | B2 | 1/2015 | Yen et al. |
| (Continued) | | | |

FOREIGN PATENT DOCUMENTS

| CN | 103904053 A | 7/2014 |
| CN | 103972207 A | 8/2014 |
| (Continued) | | |

OTHER PUBLICATIONS

International Search Report cited in PCT/CN2022/128683 mailed Apr. 28, 2023, 7 pages.

*Primary Examiner* — Benjamin Tzu-Hung Liu
(74) *Attorney, Agent, or Firm* — Syncoda LLC; Feng Ma

(57)                ABSTRACT

The present disclosure provides a semiconductor package structure, relating to the technical field of semiconductors. The semiconductor package structure includes: a substrate; and at least one chip stack structure provided on the substrate, where the at least one chip stack structures include a plurality of first chips vertically stacked, each of the first chips includes a first conductive plug set, a connection layer is provided between two adjacent first chips, a wire structure is provided in the connection layer, the wire structure is electrically connected to the first conductive plug sets in two first chips adjacent to the wire structure, projections of two first conductive plug sets electrically connected to a same wire structure on the substrate are staggered from each other, and the first conductive plug sets in the plurality of first chips are connected in series through the wire structures to form an inductor structure.

20 Claims, 6 Drawing Sheets

(51) Int. Cl.
  *H10W 20/20*          (2026.01)
  *H10W 90/00*          (2026.01)
(58) Field of Classification Search
  CPC .... H10B 80/00; H10W 20/497; H10W 20/20;
                    H10W 90/00; H10W 90/724
  See application file for complete search history.

(56)                References Cited

U.S. PATENT DOCUMENTS

|  |  |  |  |
|---|---|---|---|
| 9,013,892 B2 | 4/2015 | Liu et al. | |
| 11,043,470 B2 | 6/2021 | Jing et al. | |
| 2017/0345754 A1 | 11/2017 | Yun et al. | |
| 2018/0277516 A1* | 9/2018 | Kume | H01L 25/0657 |
| 2020/0051933 A1 | 2/2020 | Cha et al. | |
| 2021/0384291 A1 | 12/2021 | Zeng et al. | |
| 2022/0406882 A1* | 12/2022 | Kim | H01F 17/0006 |
| 2024/0098965 A1* | 3/2024 | Sharma | H10B 53/30 |

FOREIGN PATENT DOCUMENTS

| | | | |
|---|---|---|---|
| CN | 107452709 A | 12/2017 | |
| CN | 114566593 A | 5/2022 | |
| CN | 114730754 A | 7/2022 | |

\* cited by examiner

SEMICONDUCTOR PACKAGE STRUCTURE

CROSS-REFERENCE TO RELATED APPLICATIONS

This is a continuation of International Patent Application No. PCT/CN2022/128683, filed on Oct. 31, 2022, which claims priority to Chinese Patent Application No. 202211157657.X, titled "SEMICONDUCTOR PACKAGE STRUCTURE" and filed on Sep. 22, 2022. The disclosures of International Patent Application No. PCT/CN2022/128683 and Chinese Patent Application No. 202211157657.X are incorporated herein by reference in their entireties.

TECHNICAL FIELD

The present disclosure relates to, but is not limited to, a semiconductor package structure.

BACKGROUND

At present, to further improve the integration level of an integrated circuit (IC) and achieve better performance and lower power consumption, a plurality of chips are packaged in a same package structure. This can increase the package density and miniaturize a package body, thereby increasing the speed of signal transmission between the chips. Devices with different functions can also be packaged in the same package structure. For example, to prevent the chips from being interfered by noise during signal transmission and improve the communication quality of the chips, a special inductor can be integrated in the package structure.

However, with continuous development of the IC in the direction of high density, multi-function, low power consumption and miniaturization, the size of the inductor integrated in the package structure is getting smaller and smaller. In this case, it is difficult to meet the application requirements of the package structure, and the problem of electromagnetic signal interference is prone to occur, thereby reducing the working efficiency and performance of the package structure.

SUMMARY

An overview of the subject described in detail in the present disclosure is provided below, which is not intended to limit the protection scope of the claims.

The present disclosure provides a semiconductor package structure.

The present disclosure provides a semiconductor package structure, including:

a substrate; and at least one chip stack structure provided on the substrate, where the at least one chip stack structure includes a plurality of first chips vertically stacked, each of the first chips includes a first conductive plug set, the first conductive plug set includes a plurality of first conductive plugs, a connection layer is provided between two adjacent first chips, a wire structure is provided in the connection layer, the wire structure is electrically connected to the first conductive plug sets in two first chips adjacent to the wire structure, projections of two first conductive plug sets electrically connected to a same wire structure on the substrate are staggered from each other, and the first conductive plug sets in the plurality of first chips are connected in series through the wire structures to form an inductor structure.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

REFERENCE NUMERALS

Figure 1:
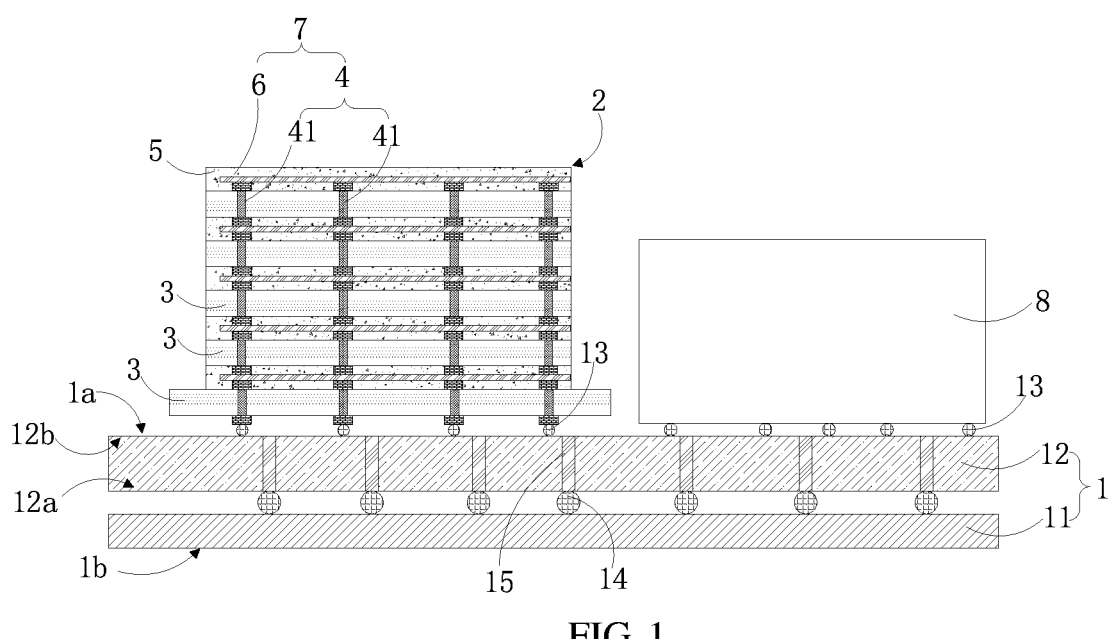
FIG. 1 is a schematic diagram of a semiconductor package structure according to an exemplary embodiment.

1. Substrate; 1a. Top surface of a substrate; 1b. Bottom surface of a substrate; 11. Package substrate; 12. Interposer; 12a. First surface; 12b. Second surface; 13. First welding block; 14. Second welding block; 15. Through silicon via structure; 2. Chip stack structure; 3. First chip; 31. First interconnect line; 32. Second interconnect line; 4. First conductive plug set; 41. First conductive plug; 42. Second conductive plug; 5. Connection layer; 6. Wire structure; 61. First wire; 62. Second wire; 63. Third wire; 64. Opening; 65. Conductive connection structure; 7. Inductor structure; 71. Core; 8. Second chip; 9. Contact spacer;

A-A. Virtual axis; D1. First direction; and D2—Second direction.

DETAILED DESCRIPTION

The technical solutions in the embodiments of the present disclosure are described below clearly and completely referring to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A plurality of chips are packaged in a same package structure, which is usually for high-bandwidth communication. A wide communication band may interfere with signal transmission of stacked chips. With this regard, in the related art, by integrating an inductor structure in a package structure, and by removing interference noise in the package structure through an inductive effect generated by the inductor structure, the signal-to-noise ratio of chip communication in the package structure is increased, and the communication quality of the chips is improved. However, if an external inductor structure (for example, an independent inductor) is provided in the package structure, the distance between the inductor structure and a circuit in the chip is relatively long, and the effect of the inductor structure on removing interference noise is limited. Moreover, as the size of the package structure shrinks continuously, the size of the inductor structure shrinks, and it is more difficult for the inductor structure to meet the noise reduction requirements of the package structure. Moreover, the external inductor structure is integrated in the package structure to occupy the area of the package structure, such that the applicable area of the package structure is reduced, and it is not conducive to increasing the integration density of the package structure.

The through silicon via (TSV) technology is very important for the package structure, especially the package structure including a plurality of stacked chips. It is necessary to form a conductive plug in each chip through the TSV technology, and the plurality of chips are electrically connected through the conductive plug.

An exemplary embodiment of the present disclosure provides a semiconductor package structure. The semiconductor package structure includes a chip stack structure. A first conductive plug set is provided in each first chip of the chip stack structure. The first conductive plug sets in two adjacent first chips are connected through a wire structure in a connection layer. The first conductive plug sets in the plurality of first chips are connected in series through the wire structures to form an inductor structure in the chip stack structure. When the chip stack structure is powered on, the inductor structure generates inductance, which can reduce or eliminate communication noise of each first chip and improve the communication quality of the first chip. Moreover, in this embodiment, the inductor structure is formed in the chip stack structure. The distance between the inductor structure and the circuit in each first chip is closer, and the noise reduction effect of the inductor structure is better. Therefore, it is not necessary to integrate an external inductor structure (for example, an independent inductor provided outside the chip stack structure) in the semiconductor package structure, thereby releasing the applicable space of the semiconductor package structure, facilitating miniaturization of the semiconductor package structure, and increasing the integration density of the semiconductor package structure.

An exemplary embodiment of the present disclosure provides a semiconductor package structure. This embodiment does not limit the type of the semiconductor package structure. The semiconductor package structure may be a 2.5-dimensional package structure or a 3-dimensional package structure. As shown in FIG. 1, the semiconductor package structure includes a substrate 1 and at least one chip stack structure 2 provided on the substrate 1. The at least one chip stack structure 2 includes a plurality of first chips 3 vertically stacked. Each of the first chips 3 includes a first conductive plug set 4, and the first conductive plug set 4 includes a plurality of first conductive plugs 41. A connection layer 5 is provided between two adjacent first chips 3, a wire structure 6 is provided in the connection layer 5, and the wire structure 6 is electrically connected to the first conductive plug sets 4 in two first chips 3 adjacent to the wire structure 6. Projections of two first conductive plug sets 4 electrically connected to a same wire structure 6 on the substrate 1 are staggered from each other. The first conductive plug sets 4 in the plurality of first chips 3 are connected in series through the wire structures 6 to form an inductor structure 7.

As shown in FIG. 1, the substrate 1 includes a top surface 1a and a bottom surface 1b, which are both flat surfaces. The top surface 1a of the substrate 1 may be provided with any form of connection member according to the requirements. The connection member may be configured to connect the chip stack structure 2 and the substrate 1, and may also be configured to electrically connect any other type of electronic device and the substrate 1. For example, as shown in FIG. 1, the top surface 1a of the substrate 1 may be provided with a plurality of first welding blocks 13, and the chip stack structure 2 is electrically connected to the substrate 1 through the first welding blocks 13. The bottom surface 1b of the substrate 1 may also be provided with a connection member according to application requirements, which is electrically connected to other electronic devices located outside the semiconductor package structure.

The substrate 1 may be of a single-layer or multi-layer structure. In some embodiments, as shown in FIG. 1, the substrate 1 includes a package substrate 11 and an interposer 12. The interposer 12 includes a first surface 12a and a second surface 12b opposite to each other. The first surface 12a of the interposer 12 is connected to the package substrate 11. At least one chip stack structure 2 is provided on the second surface 12b of the interposer 12. The chip stack structure 2 is connected to the package substrate 11 through the interposer 12, thereby reducing the adverse effect of the stress on the semiconductor package structure, and facilitating heat dissipation of the semiconductor package structure. The package substrate 11 includes a power terminal (not shown in the figure). The first surface 12a of the interposer 12 is connected to the power terminal of the package substrate 11 through a second welding block 14. A TAV structure 15 is provided in the interposer 12, and the interposer 12 supplies power to the chip stack structure 2 through the TAV structure 15. The material of the package substrate 11 may include any material of a semiconductor substrate, and the material of the interposer 12 may include a dielectric material. For example, the material of the interposer 12 may include silicon.

The chip stack structure 2 is stacked on the top surface 1a of the substrate 1. Each chip stack structure 2 includes a plurality of first chips 3. In this embodiment, each chip stack structure 2 includes a plurality of first chips 3, indicating that there are two or more first chips 3 in each chip stack structure 2. For example, each chip stack structure 2 may include two first chips 3, four first chips 3, five first chips 3, six first chips 3, or more first chips 3. Each of the plurality of first chips 3 may be any type of die or bare chip.

In some embodiments, the first chip 3 includes a memory chip. For example, the first chip may be at least one memory chip of a dynamic random access memory (DRAM) chip, a flash memory (NAND) chip, a static random access memory (SRAM) chip, a read-only memory (ROM) chip, a magnetic random access memory (MRAM) chip, and a non-volatile memory (RRAM) chip. It can be understood that the number of the plurality of first chips 3 and the size of each first chip 3 can be adjusted according to factors such as the design and size of the semiconductor package structure but are not limited thereby. For example, in this embodiment, with reference to a direction shown in FIG. 1, the chip stack structure 2 includes five first chips 3 provided on the top surface 1a of the substrate 1. The first chip 3 located at the lowermost part of the chip stack structure 2 is a logic chip, and the remaining four first chips 3 are high-bandwidth memory (HBM) chips. The logic chip is configured to control signal transmission between the HBM chip thereon and the substrate 1.

As shown in FIG. 1, each first chip 3 is provided with at least one first conductive plug set 4. Each first conductive plug set 4 includes a plurality of first conductive plugs 41. In this embodiment, each first conductive plug set 4 includes a plurality of first conductive plugs 41, indicating that there are two or more first conductive plugs 41 in each first conductive plug set 4. For example, each first conductive plug set 4 may include two first conductive plugs 41, three first conductive plugs 41, four first conductive plugs 41, five first conductive plugs 41, or the like. There may be the same or different numbers of first conductive plugs 41 in the first conductive plug set 4 of each first chip 3.

The plurality of first chips 3 are vertically stacked to form the chip stack structure 2. Adjacent first chips 3 are connected together through the connection layer 5. The material of the connection layer 5 includes a non-conductive material. For example, the material of the connection layer 5 may include a non-conductive organic material or a non-conductive inorganic material.

As shown in FIG. 1, FIG. 2, FIG. 3, FIG. 4 and FIG. 5, a wire structure 6 is provided in the connection layer 5. The first conductive plug sets 4 in two adjacent first chips 3 are electrically connected to a same wire structure 6, and projections of the first conductive plug sets 4 in two adjacent first chips 3 on the substrate 1 are staggered from each other.

It can be understood that, the projections of the first conductive plug sets 4 in two adjacent first chips 3 on the substrate 1 are staggered from each other, indicating that the projections of the first conductive plug sets 4 in two adjacent first chips 3 on the substrate 1 are not overlapped and have no overlap part. The projections of the first conductive plug sets 4 in two adjacent first chips 3 formed on the substrate 1 are two groups of independent patterns. Along a direction of stacking the plurality of first chips 3, the first conductive plug sets 4 in the plurality of first chips 3 are sequentially connected through the wire structures 6 in the connection layers 5 to form at least one inductor structure 7 in the chip stack structure 2.

As shown in FIG. 1, the chip stack structure 2 is provided on the substrate 1. With reference to the direction shown in FIG. 1, the first conductive plug set 4 in the first chip 3 in the lowermost part of the chip stack structure 2 is electrically connected to the substrate 1 through a first welding block 13.

According to the semiconductor package structure in this embodiment, the first conductive plug set 4 in the first chip 3 and the wire structure 6 in the connection layer 5 form an inductor structure 7 in the chip stack structure 2. Inductance of the inductor structure 7 can reduce or eliminate communication noise of the first chip 3, thereby increasing the communication signal-to-noise ratio of the first chip 3, and improving the communication quality of the first chip 3. Moreover, the semiconductor package structure in this embodiment does not need to integrate a passive inductor device on the substrate 1, which can increase the integration density of the semiconductor package structure and further reduce the size of the semiconductor package structure.

Figure 2:
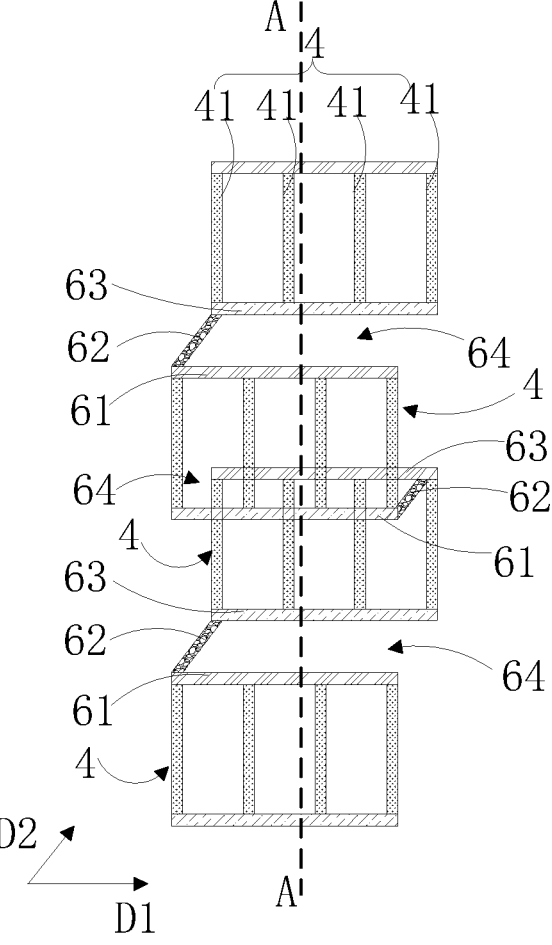
FIG. 2 is a schematic diagram of an inductor structure according to an exemplary embodiment.

As shown in FIG. 2, in this embodiment, along a direction in which the plurality of first chips 3 are stacked, the wire structures 6 in the connection layers 5 and the first conductive plug sets 4 in the first chips 3 are sequentially connected to form a spiral structure arranged around a virtual axis A-A, and the virtual axis A-A is perpendicular to the top surface 1a of the substrate 1. The spiral structure is formed by arranging the first conductive plug sets 4 in the first chips 3 and the wire structures 6 in the connection layers 5 around the virtual axis A-A, and the spiral structure is taken as a spiral coil of the inductor structure 7, and the spiral coil can be wound clockwise or counterclockwise around the virtual axis A-A. In this embodiment, the inductor structure 7 formed in the chip stack structure 2 is an air core inductor. The air core inductor is simpler in structure, thereby conveniently adjusting the design and layout of the first conductive plug sets 4 in the first chips 3 and the wire structures 6 in the connection layers 5, and reducing the size of the inductor structure 7.

It can be understood that the first conductive plug sets 4 in two adjacent first chips 3 can be sequentially connected through the wire structures 6 in the connection layers 5, to form a spiral structure arranged around the virtual axis A-A. The spiral structure is formed by arranging the first conductive plug sets 4 in the first chips 3 and the wire structures 6 in the connection layers 5 around the virtual axis A-A, and the size and shape of each coil of the spiral structure may be the same or different.

Figure 3:
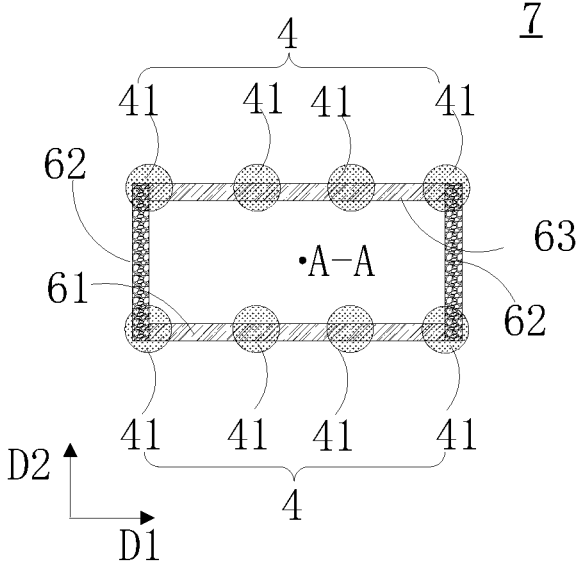
FIG. 3 is a projection drawing of an inductor structure according to an exemplary embodiment formed on a substrate.
Figure 4:
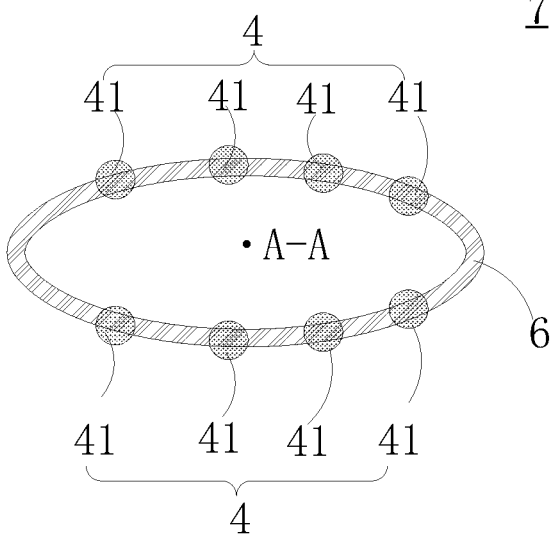
FIG. 4 is a projection drawing of an inductor structure according to an exemplary embodiment formed on a substrate.

In some embodiments, as shown in FIG. 3 and FIG. 4, the patterns formed by projections of two adjacent wire structures 6 on the substrate 1 are symmetrically arranged with the virtual axis A-A as a center of symmetry. The first conductive plug set 4 in each first chip 3 may include the same number of first conductive plugs 41. The first conductive plug set 4 in each first chip 3 may include five first conductive plugs 41. The five first conductive plugs 41 are arranged at equal intervals. The first conductive plugs 41 in the first conductive plug set 4 in each first chip 3 are arranged according to the same rule. The wire structure 6 in each connection layer 5 also has the same size.

In this embodiment, the spiral structure is formed by arranging the first conductive plug sets 4 in the first chips 3 and the wire structures 6 in the connection layers 5 around the virtual axis A-A, and the size and shape of each coil of the spiral structure are the same, such that the manufacturing and layout of the chip stack structure 2 are simpler, thereby facilitating mass production of the semiconductor package structure.

Figure 5:
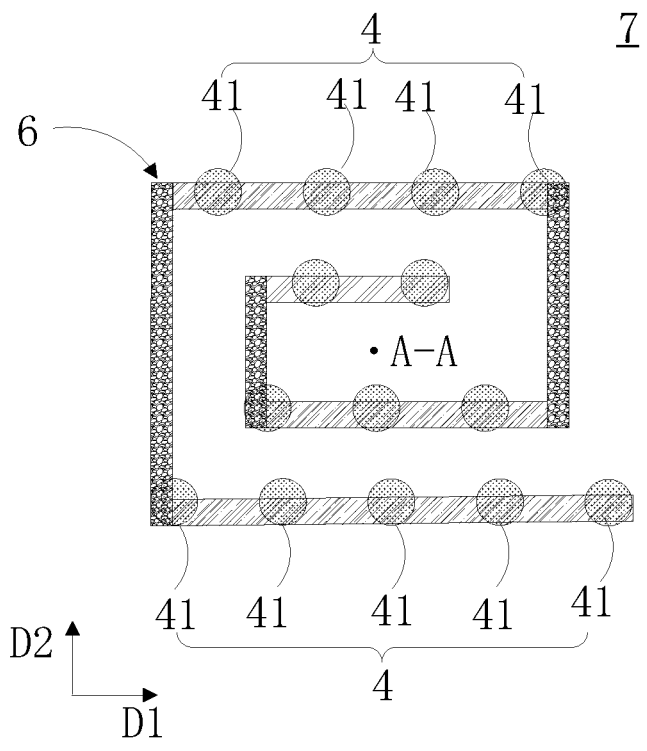
FIG. 5 is a projection drawing of an inductor structure according to an exemplary embodiment formed on a substrate.

In some other embodiments, as shown in FIG. 5, patterns formed by projections of the first conductive plug sets 4 in the plurality of first chips 3 and the wire structures 6 in the connection layers 5 on the substrate 1 are spiral patterns arranged around the virtual axis A-A.

As shown in FIG. 5, the first conductive plug sets 4 in different first chips 3 may include different numbers of first conductive plugs 41. Or, the first conductive plugs 41 in the first conductive plug sets 4 in different first chips 3 may have different arrangement spacings.

For example, with reference to the direction shown in FIG. 1, along a direction away from the top surface of the substrate 1, the numbers of first conductive plug sets 4 in the first chips 3 increase sequentially. Moreover, along the direction away from the top surface of the substrate 1, the sizes of the wire structures 6 in the connection layers 5 may increase sequentially. The first conductive plugs 41 in the first conductive plug set 4 in each first chip 3 are arranged at equal intervals. Along the direction away from the top surface 1*a* of the substrate 1, the first conductive plug sets 4 in the plurality of first chips 3 and the wire structures 6 in the connection layers 5 form inductor structures 7 having gradually increasing sizes.

It can be understood that, in other embodiments, the first conductive plug sets 4 in the plurality of first chips 3 and the wire structures 6 in the connection layers 5 form inductor structures 7 having gradually decreasing sizes.

According to an exemplary embodiment, a semiconductor package structure is shown. The semiconductor package structure in this embodiment includes all the structures of the semiconductor package structure according to the above embodiment. In this embodiment, as shown in FIG. 1 and FIG. 2, a pattern enclosed by the wire structure 6 in each of the connection layers 5 includes an opening 64, an orientation of the opening 64 is parallel to the top surface 1*a* of the substrate 1, and orientations of openings 64 of patterns enclosed by the wire structures 6 in two adjacent connection layers 5 are opposite. In a direction from the bottom surface 1*b* of the substrate 1 to the top surface 1*a* of the substrate 1, the chip stack structure 2 includes a plurality of connection layers 5 sequentially arranged between two adjacent first chips 3. Each connection layer 5 is provided with a wire structure 6. Along the direction away from the top surface 1*a* of the substrate 1, the orientations of the openings 64 in the wire structures 6 in an odd number of connection layers 5 are the same, the orientations of the openings 64 in the wire structures 6 in an even number of connection layers 5 are the same, and the orientations of the openings 64 in the wire structures 6 in an odd number of connection layers 5 are opposite to the orientations of the openings 64 in the wire structures 6 in an even number of connection layers 5.

As shown in FIG. 1, a contact spacer 9 is provided between each first conductive plug 41 and the wire structure 6. Each first conductive plug 41 is connected to the wire structure 6 through the contact spacer 9. Each first conductive plug set 4 includes a plurality of first conductive plugs 41, and the wire structure 6 in each connection layer 5 is connected to the plurality of first conductive plugs 41 in the first conductive plug set 4 through a plurality of contact spacers 9.

As shown in FIG. 1 and FIG. 2, the chip stack structure 2 includes five first chips 3 vertically stacked. In the direction from the bottom surface 1*b* of the substrate 1 to the top surface 1*a* of the substrate 1, the chip stack structure 2 includes four connection layers 5 sequentially arranged between two adjacent first chips 3. Along the direction away from the top surface 1*a* of the substrate 1, the orientations of the openings 64 in the wire structures 6 in the first and third connection layers 5 are toward a same side, the orientations of the openings 64 in the wire structures 6 in the second and fourth connection layers 5 are toward a same side, and the orientations of the openings 64 in the wire structures 6 in the first connection layer 5 are opposite to the orientations of the openings 64 in the wire structures 6 in the second connection layer 5.

In some examples, as shown in FIG. 1, FIG. 2 and FIG. 3, the wire structure 6 in each connection layer 5 includes a first wire 61, a second wire 62 and a third wire 63, which are sequentially connected end to end. Each connection layer is in contact with two first chips 3, the first wire 61 in each connection layer 5 is connected to the first conductive plug set 4 in one of the two first chips 3, and the third wire 63 in each connection layer 5 is connected to the first conductive plug set 4 in the other of the two first chips 3.

A projection of the inductor structure 7 formed on the substrate 1 is shown in FIG. 3. The projection of the first wire 61 and the third wire 63 in one connection layers 5 on the substrate 1 overlaps with the projection of the first wire 61 and the third wire 63 in adjacent connection layer 5 on the substrate, and the projections of the second wires 62 in two adjacent connection layers 5 on the substrate 1 are staggered from each other and are respectively located on two sides of the projection of the first wire 61 and the third wire 63 on the substrate 1.

As shown in FIG. 2 and FIG. 3, the first wire 61 and the third wire 63 in each connection layer 5 extend along a first direction D1, and the second wire 62 in each connection layer 5 extends along a second direction D2. The projections of the wire structures 6 in two adjacent connection layers 5 formed on the substrate 1 are rectangular patterns. The projection of the first wire 61 and the third wire 63 in one of two adjacent connection layers 5 formed on the substrate 1 overlaps with the projection of the first wire 61 and the third wire 63 in the other of two adjacent connection layers 5 formed on the substrate 1, to form two edges of the rectangular pattern extending along the first direction D1. The projections of the second wires 62 in two adjacent connection layers 5 formed on the substrate 1 are respectively two edges of the rectangular pattern extending along the second direction D2.

In this example, the plurality of first conductive plugs 41 in each first conductive plug set 4 are arrayed along the first direction D1. The first conductive plug sets 4 in two adjacent first chips 3 are connected to a same wire structure 6. The first conductive plug set 4 in one of the two first chips 3 is connected to the first wire 61 in the wire structure 6, and the first conductive plug set 4 in the other of the two first chips 3 is connected to the third wire 63 in the wire structure 6, such that the first conductive plug sets 4 in two adjacent first chips 3 are electrically connected through the second wire 62 of the wire structure 6.

In some examples, the wire structure 6 in the connection layer 5 is a C-shaped structure (not shown in the figure) arranged parallel to the top surface 1*a* of the substrate 1. The projection of the inductor structure 7 formed on the substrate 1 is shown in FIG. 4. The orientations of the openings 64 of the wire structures 6 in two adjacent connection layers 5 are opposite. Along the direction of stacking the plurality of first chips 3, the wire structure 6 in each connection layer 5 is connected to the first conductive plug sets 4 in two first chips 3. The first conductive plug sets 4 in two first chips 3 are respectively connected to some of structures located on two sides of the opening 64 of the C-shaped structure, thereby forming the spiral structure in the chip stack structure 2.

According to the semiconductor package structure in this embodiment, the structure and layout of the first conductive plug set 4 in the first chip 3 are simple. The first conductive plug set 4 in the first chip 3 and the wire structure 6 in the connection layer 5 form a hollowed inductor structure 7. Inductance of the inductor structure 7 can effectively reduce or eliminate the communication noise of the first chip 3 to improve the communication quality of the first chip 3, the quality of the semiconductor package structure can be improved, and the service life of the semiconductor package structure can be prolonged.

Figure 6:
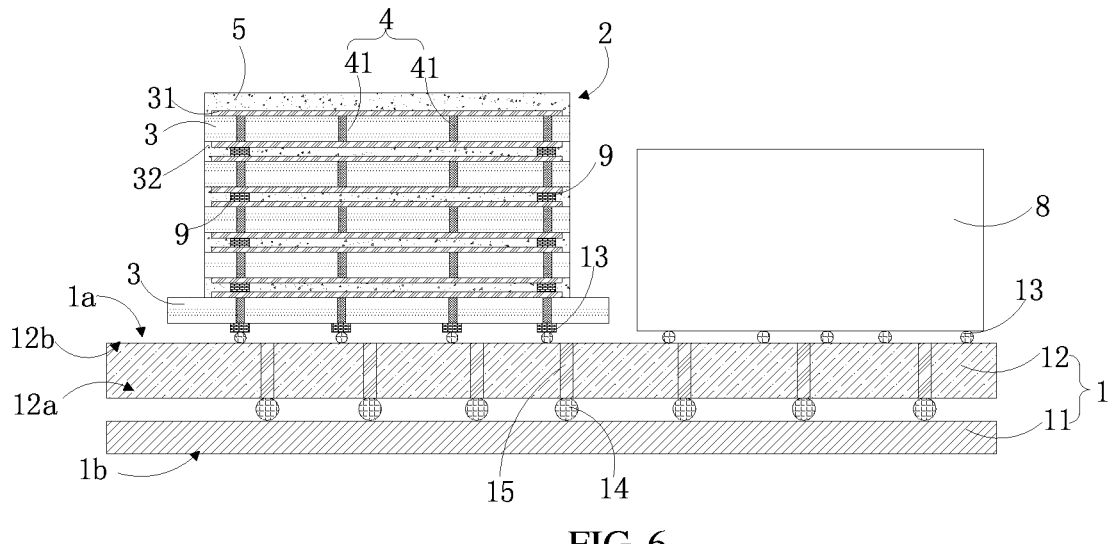
FIG. 6 is a schematic diagram of a semiconductor package structure according to an exemplary embodiment.
Figure 7:
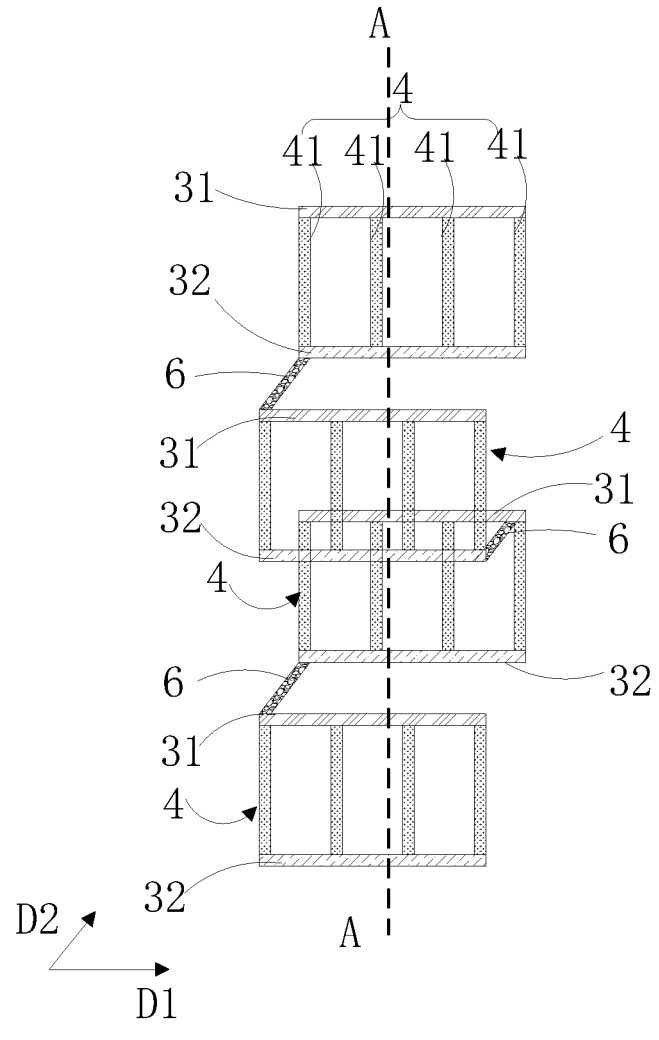
FIG. 7 is a schematic diagram of an inductor structure according to an exemplary embodiment.

According to an exemplary embodiment, a semiconductor package structure is shown. As shown in FIG. 6 and FIG. 7, the semiconductor package structure includes a substrate 1 and at least one chip stack structure 2 provided on the substrate 1. Each chip stack structure 2 includes a plurality of first chips 3 vertically stacked.

As shown in FIG. 6 and FIG. 7, each first chip 3 includes a first conductive plug set 4. The first conductive plug set 4 includes a plurality of first conductive plugs 41. Each first chip 3 further includes a first interconnect line 31 and a second interconnect line 32. The first interconnect line 31 is provided on a top surface of the first chip 3. Ends of the plurality of first conductive plugs 41 in the first conductive plug set 4 close to the top surface of the first chip 3 are electrically connected through the first interconnect line 31. The second interconnect line 32 is provided on a bottom surface of the first chip 3. Ends of the plurality of first conductive plugs 41 in the first conductive plug set 4 close to the bottom surface of the first chip 3 are electrically connected through the second interconnect line 32.

As shown in FIG. 6 and FIG. 7, a connection layer 5 is provided between two adjacent first chips 3. Each connection layer 5 is in contact with two first chips 3. A wire structure 6 is provided in the connection layer 5. The wire structure 6 in each connection layer 5 is electrically connected to a first end of the first interconnect line 31 in one of the two first chips 3 and a first end of the second interconnect line 32 in the other of the two first chips 3. Or, the wire structure 6 in each connection layer 5 is connected to a second end of the first interconnect line 31 in one of the two first chips 3 and a second end of the second interconnect line 32 in the other of the two first chips 3.

As shown in FIG. 6, the wire structure 6 in each connection layer 5 is connected to the first interconnect line 31 and the second interconnect line 32 through the contact spacer 9. The wire structure 6 is electrically connected to the first conductive plug sets 4 in two first chips 3 adjacent to the wire structure 6. The projections of two first conductive plug sets 4 electrically connected to a same wire structure 6 formed on the substrate 1 are staggered from each other. The first conductive plug sets 4 in the plurality of first chips 3 are electrically connected through the wire structures 6 to form an inductor structure 7. The projections of the wire structures 6 in two adjacent connection layers 5 on the substrate 1 are staggered from each other and are respectively located on two sides of the projection of each of the first conductive plug sets 4 in the plurality of first chips 3 on the substrate 1. For example, the plurality of first conductive plugs 41 in each first conductive plug set 4 are arrayed along the first direction D1, the first interconnect line 31 is arranged along the first direction D1, and the second interconnect line 32 is arranged along the first direction D1. The wire structure 6 in the connection layer 5 is arranged along the second direction D2. The first direction D1 is perpendicular to the second direction D2.

According to the semiconductor package structure in this embodiment, the first conductive plug set 4 in the first chip 3 is electrically connected to the second interconnect line 32 through the first interconnect line 31, thereby reducing the connection difficulty between the wire structure 6 in the connection layer 5 and the first conductive plug set 4, and improving the yield of the semiconductor package structure.

Figure 8:
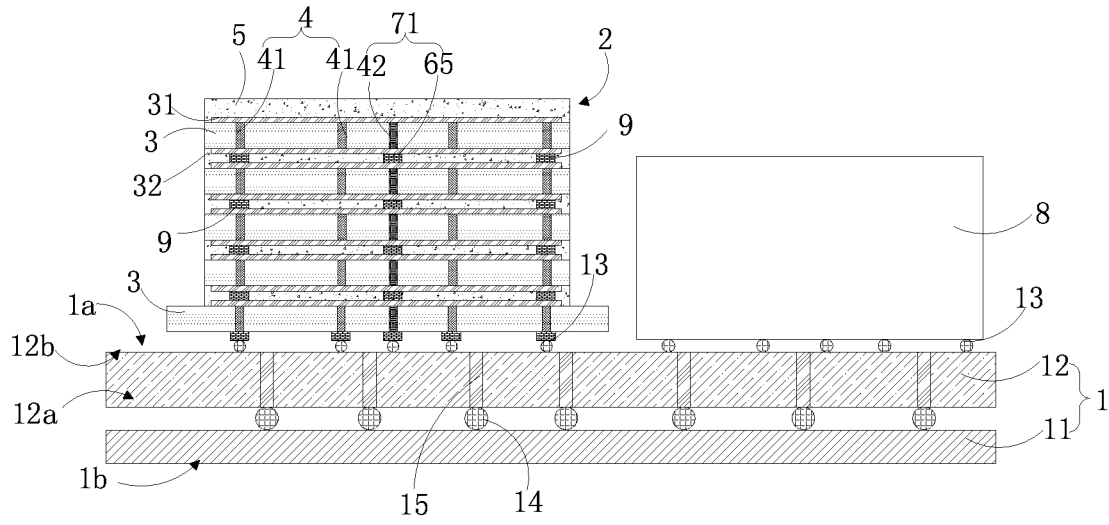
FIG. 8 is a schematic diagram of a semiconductor package structure according to an exemplary embodiment.
Figure 9:
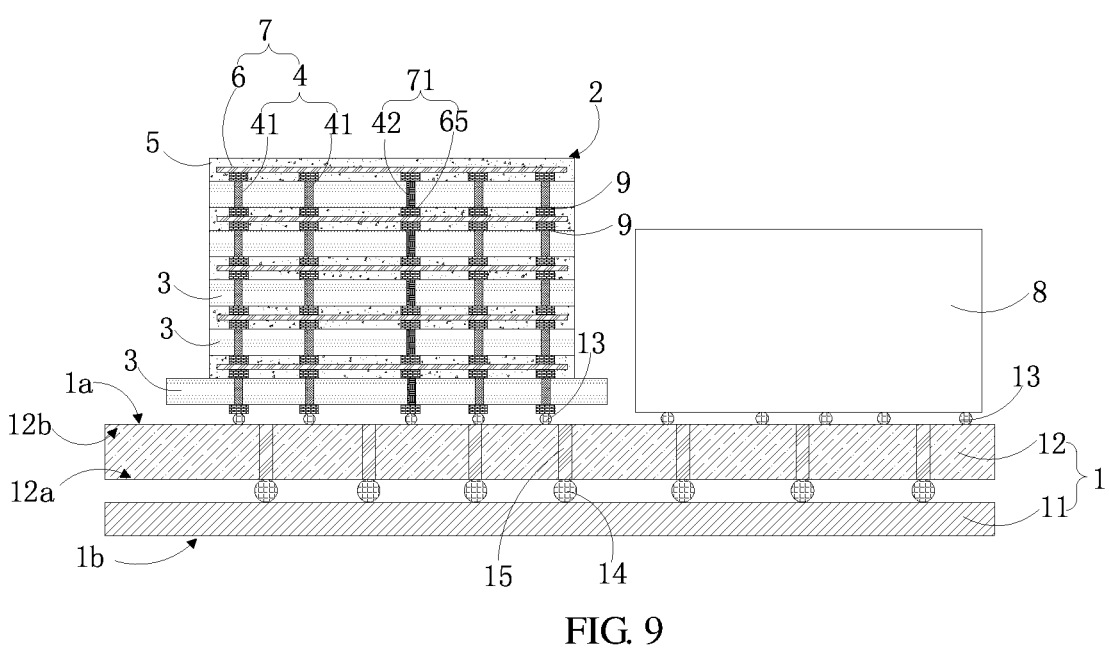
FIG. 9 is a schematic diagram of a semiconductor package structure according to an exemplary embodiment.

According to an exemplary embodiment, a semiconductor package structure is shown. As shown in FIG. 8 and FIG. 9, the semiconductor package structure includes a substrate 1 and at least one chip stack structure 2 provided on the substrate 1. The at least one chip stack structure 2 includes a plurality of first chips 3 vertically stacked. Each of the first chips 3 includes a first conductive plug set 4, and the first conductive plug set 4 includes a plurality of first conductive plugs 41. A connection layer 5 is provided between two adjacent first chips 3, a wire structure 6 is provided in the connection layer 5, and the wire structure 6 is electrically connected to the first conductive plug sets 4 in two first chips 3 adjacent to the wire structure 6. Projections of two first conductive plug sets 4 electrically connected to a same wire structure 6 on the substrate 1 are staggered from each other. The first conductive plug sets 4 in the plurality of first chips 3 are connected in series through the wire structures 6 to form an inductor structure 7.

As shown in FIG. 8, each of the first chips 3 further includes a second conductive plug 42, a conductive connection structure 65 is further provided in each of the connection layers 5, the conductive connection structure 65 is electrically connected to the second conductive plugs 42 in two first chips 3 adjacent to the conductive connection structure 65, the second conductive plugs 42 in the plurality of first chips 3 are sequentially connected through the conductive connection structures 65 in the connection layers 5 to form a core 71 arranged perpendicular to the top surface 1a of the substrate 1. The wire structures 6 in the connection layers 5 and the first conductive plug sets 4 in the first chips 3 are sequentially connected to form a spiral structure arranged around the core 71.

The core 71 formed by the second conductive plugs 42 in the first chips 3 and the conductive connection structures 65 in the connection layers 5 is taken as a magnetic core of the inductor structure 7. The spiral structure formed by the first conductive plug sets 4 in the first chips 3 and the wire structures 6 in the connection layers 5 is taken as a spiral coil of the inductor structure 7. The spiral coil is wound clockwise or anticlockwise by taking the core 71 as an axis, such that the inductance of the inductor structure 7 formed in the chip stack structure 2 is higher, the noise reduction capability of the inductor structure 7 is better, and the effects such as filtering and noise reduction (such as high-frequency noise) can be achieved, thereby further reducing the communication noise of the first chips 3, increasing the signal-to-noise ratio of the semiconductor package structure, and improving the communication quality of the first chips 3.

Figure 10:
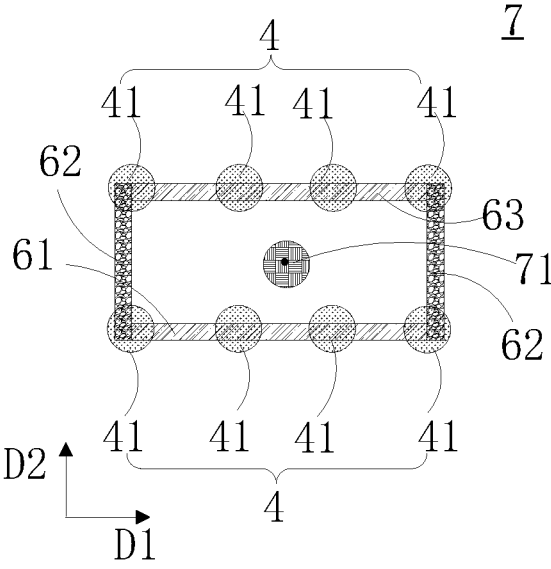
FIG. 10 is a projection drawing of an inductor structure according to an exemplary embodiment formed on a substrate.

In some examples, as shown in FIG. 10, the patterns formed by projections of two adjacent wire structures 6 on the substrate 1 are symmetrically arranged with the core 71 as a center of symmetry. In some other embodiments, the patterns formed by projections of the first conductive plug sets 4 in the plurality of first chips 3 and the wire structures 6 in the connection layers 5 on the substrate 1 are spiral patterns arranged around the core 71.

As shown in FIG. 2, a pattern enclosed by the wire structure 6 in each of the connection layers 5 includes an opening 64, an orientation of the opening 64 is parallel to the top surface 1a of the substrate 1, and orientations of openings 64 of patterns enclosed by the wire structures 6 in two adjacent connection layers 5 are opposite.

Figure 11:
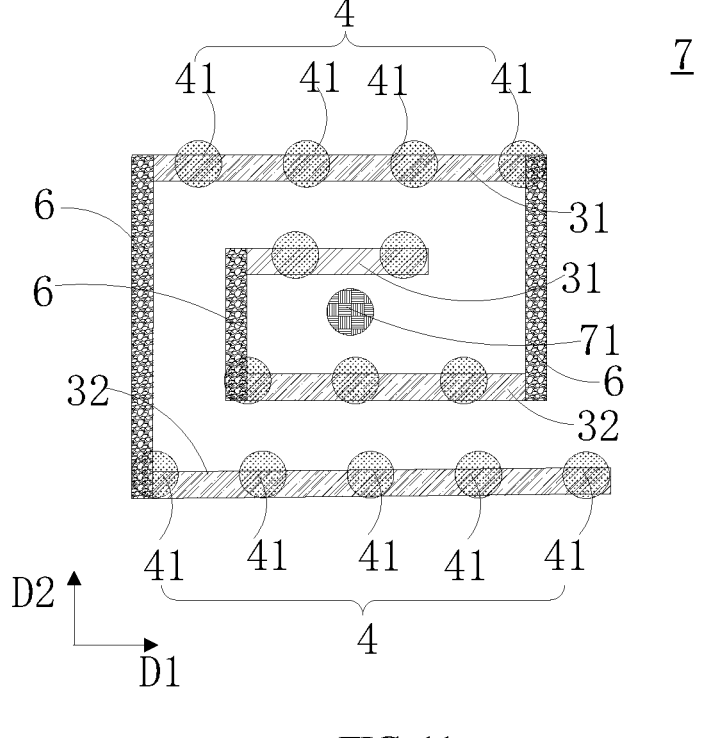
FIG. 11 is a projection drawing of an inductor structure according to an exemplary embodiment formed on a substrate.

In some other embodiments, as shown in FIG. 11, each first chip 3 further includes a first interconnect line 31 and a second interconnect line 32. The first interconnect line 31 is provided on a top surface of the first chip 3. Ends of the plurality of first conductive plugs 41 in the first conductive plug set 4 close to the top surface of the first chip 3 are electrically connected in series through the first interconnect line 31. The second interconnect line 32 is provided on a bottom surface of the first chip 3. Ends of the plurality of first conductive plugs 41 in the first conductive plug set 4 close to the bottom surface of the first chip 3 are electrically connected through the second interconnect line 32. The wire structure 6 is electrically connected to the first conductive plug sets 4 in two first chips 3 adjacent to the wire structure 6. The projections of two first conductive plug sets 4 electrically connected to a same wire structure 6 formed on the substrate 1 are staggered from each other. The first conductive plug sets 4 in the plurality of first chips 3 are electrically connected through the wire structures 6 to form an inductor structure 7.

It should be noted that, in the present disclosure, the core 71 may be provided in an embodiment shown in any of FIG. 1 to FIG. 7 (i.e., providing a solid core).

According to an exemplary embodiment, a semiconductor package structure is shown. As shown in FIG. 1, FIG. 6, FIG. 8 and FIG. 9, the semiconductor package structure includes a substrate 1 and at least one chip stack structure 2 provided on the substrate 1. The at least one chip stack structure 2 includes a plurality of first chips 3 vertically stacked. Each of the first chips 3 includes a first conductive plug set 4, and the first conductive plug set 4 includes a plurality of first conductive plugs 41. A connection layer 5 is provided between two adjacent first chips 3, a wire structure 6 is provided in the connection layer 5, and the wire structure 6 is electrically connected to the first conductive plug sets 4 in two first chips 3 adjacent to the wire structure 6. Projections of two first conductive plug sets 4 electrically connected to a same wire structure 6 on the substrate 1 are staggered from each other. The first conductive plug sets 4 in the plurality of first chips 3 are connected in series through the wire structures 6 to form an inductor structure 7.

The semiconductor package structure further includes at least one second chip 8 provided on the substrate 1, where the at least one second chip 8 and the at least one chip stack structure 2 are arranged at intervals.

At least one of the second chips 8 includes a processor chip. The processor chip includes a Processor chip, and the Processor chip is an ARM chip or RISC-V chip.

At least one of the second chips 8 may further include at least one of a DSP chip, an AI chip, a memory chip, a data conversion chip and a radio-frequency chip.

The embodiments or implementations of this specification are described in a progressive manner, and each embodiment focuses on differences from other embodiments. The same or similar parts between the embodiments may refer to each other.

In the description of this specification, the description referring to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail referring to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor package structure provided by the present disclosure, the first conductive plug sets in the plurality of first chips are connected in series through the wire structures to form the inductor structure in the chip stack structure. When the chip stack structure is turned on, the inductor structure generates inductance to achieve the effects such as filtering and noise reduction (such as high-frequency noise).

The invention claimed is:

1. A semiconductor package structure, comprising:
   a substrate; and
   at least one chip stack structure, provided on the substrate, wherein the at least one chip stack structure comprises a plurality of first chips vertically stacked, each of the first chips comprises a first conductive plug set, the first conductive plug set comprises a plurality of first conductive plugs, a connection layer is provided between two adjacent first chips, a wire structure is provided in the connection layer, the wire structure is electrically connected to the first conductive plug sets in two first chips adjacent to the wire structure, projections of two first conductive plug sets electrically connected to a same wire structure on the substrate are staggered from each other, and the first conductive plug sets in the plurality of first chips are connected in series through the wire structures to form an inductor structure;
   wherein each of the first chips further comprises a second conductive plug, a conductive connection structure is further provided in each of the connection layers, the conductive connection structure is electrically connected to the second conductive plugs in two first chips adjacent to the conductive connection structure, the second conductive plugs in the plurality of first chips are sequentially connected through the conductive connection structures in the connection layers to form a core arranged perpendicular to a top surface of the substrate, and the wire structures in the connection layers and the first conductive plus sets in the first chips are sequentially connected to form a spiral structure arranged around the core.

2. The semiconductor package structure according to claim 1, wherein patterns formed by projections of two adjacent wire structures on the substrate are symmetrically arranged with the core as a center of symmetry.

3. The semiconductor package structure according to claim 1, wherein a pattern enclosed by the wire structure in each of the connection layers comprises an opening, an orientation of the opening is parallel to the top surface of the substrate, and orientations of openings of patterns enclosed by the wire structures in two adjacent connection layers are opposite.

4. The semiconductor package structure according to claim 3, wherein the wire structure in each of the connection layers comprises a first wire, a second wire and a third wire; and the first wire, the second wire and the third wire are sequentially connected end to end; and each of the connection layers is in contact with two first chips, the first wire in each of the connection layers is connected to the first conductive plug set in one of the two first chips, and the third wire in each of the connection layers is connected to the first conductive plug set in the other of the two first chips.

5. The semiconductor package structure according to claim 4, wherein a projection of the first wire and the third wire in one connection layer on the substrate overlaps with a projection of the first wire and the third wire in adjacent connection layer on the substrate, and projections of the second wires in two adjacent connection layers on the substrate are staggered from each other and are respectively located on two sides of the projection the first wire and the third wire on the substrate.

6. The semiconductor package structure according to claim 1, wherein each of the first chips further comprises:

a first interconnect line, provided on a top surface of the first chip, wherein ends of the plurality of first conductive plugs in the first conductive plug set close to the top surface of the first chip are electrically connected in series through the first interconnect line; and a second interconnect line, provided on a bottom surface of the first chip, wherein ends of the plurality of first conductive plugs in the first conductive plug set close to the bottom surface of the first chip are electrically connected through the second interconnect line.

7. The semiconductor package structure according to claim 6, wherein each of the connection layers is in contact with two first chips;

the wire structure in each of the connection layers is electrically connected to a first end of the first interconnect line in one of the two first chips and a first end of the second interconnect line in the other of the two first chips;

or, the wire structure in each of the connection layers is connected to a second end of the first interconnect line in one of the two first chips and a second end of the second interconnect line in the other of the two first chips.

8. The semiconductor package structure according to claim 7, wherein projections of the wire structures in two adjacent connection layers on the substrate are staggered from each other and are respectively located on two sides of projections of the first conductive plug sets in the plurality of first chips on the substrate.

9. The semiconductor package structure according to claim 1, wherein the plurality of first conductive plugs in each of the first conductive plug sets are arrayed along a first direction.

10. The semiconductor package structure according to claim 1, wherein the substrate comprises:

a package substrate; and an interposer, comprising a first surface and a second surface opposite to each other, wherein the first surface is connected to the package substrate, and the at least one chip stack structure is arranged on the second surface.

11. The semiconductor package structure according to claim 1, wherein the first chip comprises a memory chip.

12. The semiconductor package structure according to claim 1, further comprising:

at least one second chip, provided on the substrate, wherein the at least one second chip and the at least one chip stack structure are arranged at intervals.

13. The semiconductor package structure according to claim 12, wherein at least one of the second chips comprises a processor chip.

14. A semiconductor package structure, comprising:

a substrate; and at least one chip stack structure, provided on the substrate, wherein the at least one chip stack structure comprises a plurality of first chips vertically stacked, each of the first chips comprises a first conductive plug set, the first conductive plug set comprises a plurality of first conductive plugs, a connection layer is provided between two adjacent first chips, a wire structure is provided in the connection layer, the wire structure is electrically connected to the first conductive plug sets in two first chips adjacent to the wire structure, projections of two first conductive plug sets electrically connected to a same wire structure on the substrate are staggered from each other, and the first conductive plug sets in the plurality of first chips are connected in series through the wire structures to form an inductor structure;

wherein along a direction in which the plurality of first chips are stacked, the wire structures in the connection layers and the first conductive plug sets in the first chips are sequentially connected to form a spiral structure arranged around a virtual axis, and the virtual axis is perpendicular to a top surface of the substrate;

wherein each of the first chips further comprises:

a first interconnect line, provided on a top surface of the first chip, wherein ends of the plurality of first conductive plugs in the first conductive plug set close to the top surface of the first chip are electrically connected in series through the first interconnect line; and a second interconnect line, provided on a bottom surface of the first chip, wherein ends of the plurality of first conductive plugs in the first conductive plug set close to the bottom surface of the first chip are electrically connected through the second interconnect line.

15. The semiconductor package structure according to claim 14, wherein patterns formed by projections of two adjacent wire structures on the substrate are symmetrically arranged with the virtual axis as a center of symmetry.

16. The semiconductor package structure according to claim 14, wherein each of the connection layers is in contact with two first chips;

the wire structure in each of the connection layers is electrically connected to a first end of the first interconnect line in one of the two first chips and a first end of the second interconnect line in the other of the two first chips;

or, the wire structure in each of the connection layers is connected to a second end of the first interconnect line in one of the two first chips and a second end of the second interconnect line in the other of the two first chips.

17. The semiconductor package structure according to claim 16, wherein projections of the wire structures in two adjacent connection layers on the substrate are staggered from each other and are respectively located on two sides of projections of the first conductive plug sets in the plurality of first chips on the substrate.

18. The semiconductor package structure according to claim 14, wherein a pattern enclosed by the wire structure in each of the connection layers comprises an opening, an orientation of the opening is parallel to the top surface of the substrate, and orientations of openings of patterns enclosed by the wire structures in two adjacent connection layers are opposite.

19. The semiconductor package structure according to claim 18, wherein the wire structure in each of the connection layers comprises a first wire, a second wire and a third wire; and the first wire, the second wire and the third wire are sequentially connected end to end; and each of the connection layers is in contact with two first chips, the first wire in each of the connection layers is connected to the first conductive plug set in one of the two first chips, and the third wire in each of the connection layers is connected to the first conductive plug set in the other of the two first chips.

20. The semiconductor package structure according to claim 19, wherein a projection of the first wire and the third wire in one connection layer on the substrate overlaps with a projection of the first wire and the third wire in adjacent connection layer on the substrate, and projections of the second wires in two adjacent connection layers on the substrate are staggered from each other and are respectively located on two sides of the projection the first wire and the third wire on the substrate.

* * * * *